US009696598B1

(12) United States Patent
Long et al.

(10) Patent No.: US 9,696,598 B1
(45) Date of Patent: Jul. 4, 2017

(54) DISPLAY PANEL AND DISPLAY DEVICE WITH BRIGHTNESS BUFFER EFFECT

(71) Applicants: BOE TECHNOLOGY GROUP CO., LTD., Beijing (CN); CHENGDU BOE OPTOELECTRONICS TECHNOLOGY CO., LTD., Chengdu, Sichuan Province (CN)

(72) Inventors: Yue Long, Beijing (CN); Yang Wang, Beijing (CN); Tingliang Liu, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

( * ) Notice: Subject to any disclaimer, the term of this patent is extended or adjusted under 35 U.S.C. 154(b) by 0 days.

(21) Appl. No.: 15/208,835

(22) Filed: Jul. 13, 2016

(30) Foreign Application Priority Data

Jan. 4, 2016 (CN) .......................... 2016 1 0004824

(51) Int. Cl.
H01L 27/15 (2006.01)
G02F 1/015 (2006.01)
G02F 1/1343 (2006.01)
G02F 1/1368 (2006.01)
G02F 1/1362 (2006.01)
H01L 27/12 (2006.01)

(52) U.S. Cl.
CPC ........ *G02F 1/134309* (2013.01); *G02F 1/015* (2013.01); *G02F 1/1368* (2013.01); *G02F 1/13624* (2013.01); *H01L 27/1233* (2013.01); *H01L 27/1251* (2013.01); *G02F 2001/134345* (2013.01)

(58) Field of Classification Search
CPC ............... G02F 1/134309; G02F 1/015; G02F 1/13624; G02F 1/1368; H01L 27/1233; H01L 27/3218; H01L 27/1251; H01L 27/156
See application file for complete search history.

(56) References Cited

U.S. PATENT DOCUMENTS

2016/0267847 A1* 9/2016 Chen ..................... G09G 3/3283
2016/0291376 A1* 10/2016 Iwatsu .............. G02F 1/133512

* cited by examiner

Primary Examiner — Evan Pert
(74) Attorney, Agent, or Firm — Nath, Goldberg & Meyer; Joshua B. Goldberg

(57) ABSTRACT

The present invention provides a display panel and a display device. In the display panel, edges of multiple rows of pixel units are arranged in a step-like manner, each row of pixel units include a central pixel unit and a marginal pixel unit, each central pixel unit includes first thin film transistors each corresponding to a sub-pixel and having a first semiconductor region; each marginal pixel unit includes second thin film transistors each corresponding to a sub-pixel and having a second semiconductor region; length and width of the first semiconductor region are respectively set to be a first set length and a first set width, length and width of the second semiconductor region are respectively set to be a second set length and a second set width such that brightness of the marginal pixel unit is smaller than brightness of the central pixel unit during display.

20 Claims, 2 Drawing Sheets

DISPLAY PANEL AND DISPLAY DEVICE WITH BRIGHTNESS BUFFER EFFECT

TECHNICAL FIELD

The present invention belongs to the field of display technology, and particularly relates to a display panel and a display device.

BACKGROUND

With the development of intelligent technology, wearable devices have drawn more and more attention. As the wearable electronic products develops, human-interaction interfaces of wearable devices no longer use conventional rectangular panels, but increasingly use abnormity panels having shapes such as circle, octagon, etc., or even having abnormity cutting corners, so as to satisfy requirements on wearable performances or stylish design of the intelligent devices.

However, at least the following problem exists in the prior art. Abnormity display panel generally includes a display area (i.e., pixel area), a black matrix area and a filling area, and in general, the filling area needs to be filled with black matrix material to avoid light leakage. Since a conventional pixel is designed to have a rectangular shape, in order to allow an abnormity panel to have a curved or beveled border, pixels are arranged in a saw-toothed shape according to the shape of the border, so as to form a saw-toothed edge. However, the pixels arranged in the saw-toothed shape at the border of the abnormity panel can only form an approximately curved or beveled border, which will result in a strong color contrast between the saw-toothed edge of the display area having display brightness and the filling area completely presenting darkness when the abnormity display panel displays an image, and as a result, the saw-toothed edge of the display area may be observed by human eyes, thereby reducing visual effect at the edge of the display panel and seriously affecting the user experience.

SUMMARY

In view of the problem of reduced visual effect at an edge of a display panel and affected user experience due to a visible unsmooth borderline of an existing abnormity panel, the present invention provides a display panel and a display device that can have improved visual effect at the edge of the display panel and improved user experience.

In one aspect, there is provided a display device, including multiple rows of pixel units, edges of the multiple rows of pixel units being arranged in a step-like manner, each row of pixel units including at least one central pixel unit and at least one marginal pixel unit, wherein each central pixel unit includes a plurality of sub-pixels and first thin film transistors respectively corresponding to the plurality of sub-pixels, and each first thin film transistor has a first semiconductor region;

each marginal pixel unit includes a plurality of sub-pixels and second thin film transistors respectively corresponding to the plurality of sub-pixels, and each second thin film transistor has a second semiconductor region; a length of the first semiconductor region is set to be a first set length, a width of the first semiconductor region is set to be a first set width, a length of the second semiconductor region is set to be a second set length, and a width of the second semiconductor region is set to be a second set width such that brightness of the marginal pixel unit is smaller than brightness of the central pixel unit during display.

Optionally, the first semiconductor region forms a first channel region when being energized, and the second semiconductor region forms a second channel region when being energized.

Optionally, the second set length is larger than the first set length. In this case, optionally, the second set width is equal to the first set width.

Optionally, the second set width is smaller than the first set width. In this case, optionally, the second set length is equal to the first set length.

Optionally, at least one row of pixel units further include a submarginal pixel unit between the central pixel unit and the marginal pixel unit, each submarginal pixel unit includes a plurality of sub-pixels and third thin film transistors respectively corresponding to the plurality of sub-pixels, and each third thin film transistor has a third semiconductor region; a length of the third semiconductor region is set to be a third set length, a width of the third semiconductor region is set to be a third set width such that brightness of the submarginal pixel unit is smaller than brightness of the central pixel unit but larger than brightness of the marginal pixel unit during display.

Optionally, the third semiconductor region forms a third channel region when being energized.

Optionally, the second set length is larger than the third set length, and the third set length is larger than the first set length. In this case, optionally, the first set width, the second set width and the third set width are equal.

Optionally, the second set width is smaller than the third set width, and the third set width is smaller than the first set width. In this case, optionally, the first set length, the second set length and the third set length are equal.

Optionally, the display panel is any one of an in-plane switching display panel, an advanced super dimension switch display panel and a twisted nematic display panel, and when the display panel is the twisted nematic display panel, the twisted nematic display panel is in normally black mode.

In another aspect, there is provided a display device comprising a display panel, which is any one of the above display panels.

In the display panel and display device of the present invention, by setting the first set length of the first semiconductor region of the first thin film transistor in the central pixel unit and the second set length of the second semiconductor region of the second thin film transistor in the marginal pixel unit and/or the first set width of the first semiconductor region of the first thin film transistor in the central pixel unit and the second set width of the second semiconductor region of the second thin film transistor in the marginal pixel unit, brightness of a marginal pixel unit can be lower than that of a central pixel unit during display, so as to reduce brightness contrast between the central pixel unit and the filling area, i.e., to achieve a brightness buffer effect, weaken visibility of a "saw-toothed" edge to naked eyes, and attenuate the "saw-toothed" visual effect of the marginal pixel units, which further improves visual effect at the edge of an abnormity panel and improves user experience.

DETAILED DESCRIPTION

In order that those skilled in the art can better understand the technical solutions of the present invention, the present invention will be described in detail below in conjunction with the accompanying drawings and specific implementations.

Embodiment 1

Figure 1:
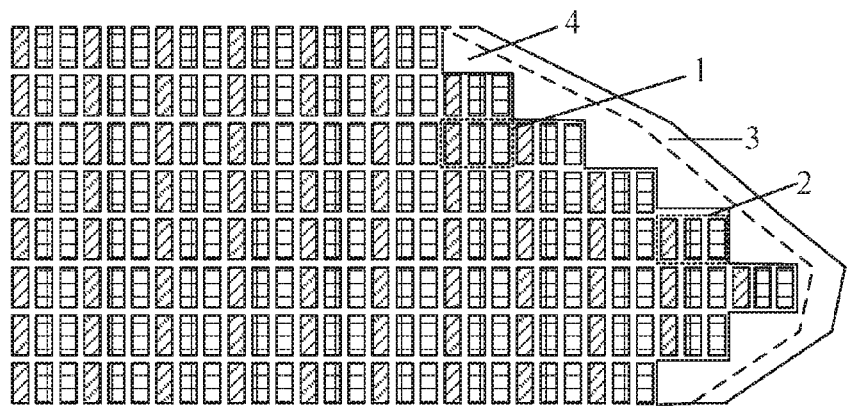
FIG. 1 is a schematic structural diagram of a display panel in Embodiments 1 and 2 of the present invention.
Figure 2:
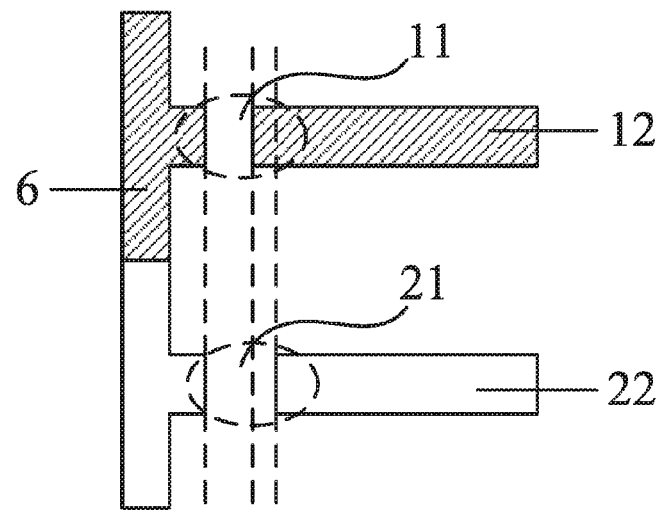
FIG. 2 is a schematic diagram illustrating a first set length and a second set length of the display panel in Embodiment 1 of the present invention.

Referring to FIGS. 1 and 2, this embodiment provides a display panel, which includes multiple rows of pixel units, edges of the multiple rows of pixel units being arranged in a step-like manner, and each row of pixel units including at least one central pixel unit 1 and at least one marginal pixel unit 2. Each central pixel unit 1 includes a plurality of sub-pixels and first thin film transistors each corresponding to one of the plurality of sub-pixels and having a first semiconductor region 11. Each marginal pixel unit 2 includes a plurality of sub-pixels and second thin film transistors each corresponding to one of the plurality of sub-pixels and having a second semiconductor region 21. A length of the first semiconductor region 11 is set to be a first set length, a width of the first semiconductor region 11 is set to be a first set width, a length of the second semiconductor region 21 is set to be a second set length, and a width of the second semiconductor region 21 is set to be a second set width such that brightness of the marginal pixel unit 2 is smaller than brightness of the central pixel unit 1 during display.

In the example shown in FIG. 2, a central pixel unit 1 refers to a pixel unit that is not in contact with a filling area 4, and a marginal pixel unit 2 refers to a pixel unit that has at least two sides in contact with the filling area 4. Of course, the marginal pixel units 2 may also be construed as pixel units at the outermost of all the pixel units and used for forming "steps", for example, in order to match the border of the display panel as well as possible, there may be a pixel unit that has only one side in contact with the filling area 4 or a pixel unit that has three sides in contact with the filling area 4. In a practical operation, in order to avoid light leakage, the filling area 4 is also filled with a black matrix material, and thus the filling area 4 and a black matrix area 3 may be formed integrally. However, in this embodiment, in order to distinguish the filling area 4 from the black matrix area 3, the filling area 4 and the black matrix area. 3 are separated by a dotted line in the drawings, as shown in FIG. 1.

Each central pixel unit 1 includes a plurality of sub-pixels (generally includes an R sub-pixel, a G sub-pixel and a B sub-pixel) and first thin film transistors respectively corresponding to the sub-pixels, and each first thin film transistor has a first semiconductor region 11 which has a length set to be a first set length and a width set to be a first set width. Each marginal pixel unit 2 includes a plurality of sub-pixels and second thin film transistors respectively corresponding to the sub-pixels, and each second thin film transistor has a second semiconductor region 21 which has a length set to be a second set length and a width set to be a second set width. It could be understood that the first semiconductor region 11 forms a first channel region when being energized, and the second semiconductor region 21 forms a second channel region when being energized.

As shown in FIG. 2, for each central pixel unit 1 (or marginal pixel unit 2), a pixel electrode signal line 6 for supplying a voltage may be connected to a central pixel electrode 12 (or a marginal pixel electrode 22) via the first semiconductor region 11 (or the second semiconductor region 21). In fact, the pixel electrode signal line 6 is formed as a whole, but in order to distinguish different parts of the pixel electrode signal line 6 corresponding to different pixel units from each other, the different parts of the pixel electrode signal line 6 are shown in different colors in FIG. 2. A region between the pixel electrode signal line 6 and the pixel electrode (the central pixel electrode 12 or the marginal pixel electrode 22) is a channel region (the first channel region or the second channel region); when a voltage is applied, carriers move from the pixel electrode signal line 6 to the pixel electrode or from the pixel electrode to the pixel electrode signal line 6 (a moving direction of the carriers between the pixel electrode signal line 6 and the pixel electrode depends from polarity of the applied voltage and polarity of the carriers), and a movable distance of the carriers between the pixel electrode signal line 6 and the pixel electrode is the length of the channel region (that is, a distance of the channel region in the moving direction of the carriers is the length of the channel region).

In the embodiment, the second set length is larger than the first set length. Since the second set length of the marginal pixel unit 2 is larger than the first set length of the central pixel unit 1, the carriers move longer in the second semiconductor region 21, that is, when carriers in the first semiconductor region 11 completely reach the central pixel electrode 12 from the pixel electrode signal line 6, carriers in the second semiconductor region 21 have not completely reached the marginal pixel electrode 22 from the pixel electrode signal line 6. That is to say, when charging of the central pixel unit 1 is finished, charging of the marginal pixel unit 2 has not finished yet, and at this point, supply of the voltage is stopped, so that charging efficiency of the marginal pixel unit 2 is lower than that of the central pixel unit 1. Therefore, during display, display brightness of the marginal pixel unit 2 is lower than that of the central pixel unit 1, so that brightness contrast between the central pixel unit 1 and the filling area 4 is reduced, i.e., a brightness buffer effect is achieved; visibility of a "saw-toothed" edge to naked eyes is weakened, and the "saw-toothed" visual effect of the marginal pixel units 2 is attenuated, which further improves visual effect at the edge of an abnormity panel and improves user experience.

The display panel may be any one of an in-plane switching (IPS) display panel, an advanced super dimension switch (ADS) display panel and a twisted nematic (TN) display panel. For a TN display panel, its display mode is preferably normally black mode. This is because for a display system in normally black mode, insufficient charging of a pixel unit means insufficient deflection of liquid crystal molecules, which will lead to lowered light transmittance, and thus the marginal pixel unit 2 has lower brightness than the central pixel unit 1.

It should be noted that in this embodiment, relation between the first set width and the second set width is not limited, for example, the first set width may be equal to the second set width, or the first set width may be larger than the second set width. Needless to say, the first set width may be slightly smaller than the second set width, as long as the display brightness of the marginal pixel unit 2 can be smaller than that of the central pixel unit 1 during display.

In the display panel of the embodiment, by setting the length of the first semiconductor region 11 of the first thin film transistor in the central pixel unit 1 to be the first set length, and the length of the second semiconductor region 21 of the second thin film transistor in the marginal pixel unit 2 to be the second set length which is larger than the first set length, charging efficiency of the marginal pixel unit 2 is lower than that of the central pixel unit 1, so that display brightness of the marginal pixel unit 2 is lower than that of the central pixel unit 1 during display, so as to reduce brightness contrast between the central pixel unit 1 and the filling area 4, i.e., to achieve a brightness buffer effect, weaken visibility of a "saw-toothed" edge to naked eyes, and attenuate the "saw-toothed" visual effect of the marginal pixel units 2, which further improves visual effect at the edge of an abnormity panel and improves user experience.

Embodiment 2

Figure 3:
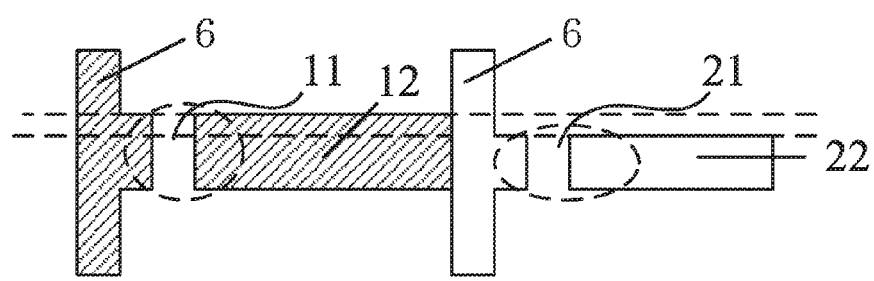
FIG. 3 is a schematic diagram illustrating a first set width and a second set width of the display panel in Embodiment 2 of the present invention.

Referring to FIGS. 1 and 3, this embodiment provides a display panel, which has a structure similar to that of the display panel in Embodiment 1, and differs from the display panel of Embodiment 1 in that, the second set width is smaller than the first set width.

As shown in FIG. 2, for each central pixel unit 1 (or marginal pixel unit 2), the pixel electrode signal line 6 for supplying a voltage may be connected to a central pixel electrode 12 (or a marginal pixel electrode 22) via the first semiconductor region 11 (or the second semiconductor region 21). In fact, the pixel electrode signal line 6 is formed as a whole, but in order to distinguish different parts of the pixel electrode signal line 6 corresponding to different pixel units, the different parts of the pixel electrode signal line 6 are shown in different colors in FIG. 2. Meanwhile, in order to show relation between widths of the first semiconductor region 11 and the second semiconductor region 21, the pixel electrode signal line 6 is shown as two separate parts in FIG. 3. A region between the pixel electrode signal line 6 and the pixel electrode (the central pixel electrode 12 or the marginal pixel electrode 22) is a channel region (the first channel region or the second channel region); when a voltage is applied, carriers move from the pixel electrode signal line 6 to the pixel electrode or from the pixel electrode to the pixel electrode signal line 6 (a moving direction of the carriers between the pixel electrode signal line 6 and the pixel electrode depends from polarity of the applied voltage and polarity of the carriers), and a length of the channel region in a direction (the vertical direction in FIGS. 2 and 3) perpendicular to the moving direction of the carriers is the width of the channel region.

In the embodiment, the second set width is smaller than the first set width, as shown in FIG. 3. As the second set width of the marginal pixel unit 2 is smaller than the first set width of the central pixel unit 1, when a voltage is applied, the total amount of carriers flowing through the second semiconductor region 21 in the marginal pixel unit 2 is decreased, thus when charging of the central pixel unit 1 is finished, charging of the marginal pixel unit 2 has not finished, and at this point, supply of the voltage is stopped, so that charging efficiency of the marginal pixel unit 2 is lower than that of the central pixel unit 1. Therefore, during display, display brightness of the marginal pixel unit 2 is lower than that of the central pixel unit 1, so that brightness contrast between the central pixel unit 1 and the filling area 4 is reduced, i.e., a brightness buffer effect is achieved, visibility of a "saw-toothed" edge to naked eyes is weakened, and the "saw-toothed" visual effect of the marginal pixel units 2 is attenuated, which further improves visual effect at the edge of an abnormity panel and improves user experience.

It should be noted that in this embodiment, relation between the first set length and the second set length is not limited, for example, the first set length may be equal to the second set length, or the first set length may be smaller than the second set length. Needless to say, the first set length may be slightly larger than the second set length, as long as the display brightness of the marginal pixel unit 2 can be smaller than that of the central pixel unit 1 during display.

In the display panel of the embodiment, by setting the width of the first semiconductor region 11 of the first thin film transistor in the central pixel unit 1 to be the first set width, and the width of the second semiconductor region 21 of the second thin film transistor in the marginal pixel unit 2 to be the second set width which is smaller than the first set width, charging efficiency of the marginal pixel unit 2 is lower than that of the central pixel unit 1, so that display brightness of the marginal pixel unit 2 is lower than that of the central pixel unit 1 during display, so as to reduce brightness contrast between the central pixel unit 1 and the filling area 4, i.e., to achieve a brightness buffer effect, weaken visibility of a "saw-toothed" edge to naked eyes, and attenuate the "saw-toothed" visual effect of the marginal pixel units 2, which further improves visual effect at the edge of an abnormity panel and improves user experience.

Embodiment 3

Figure 4:
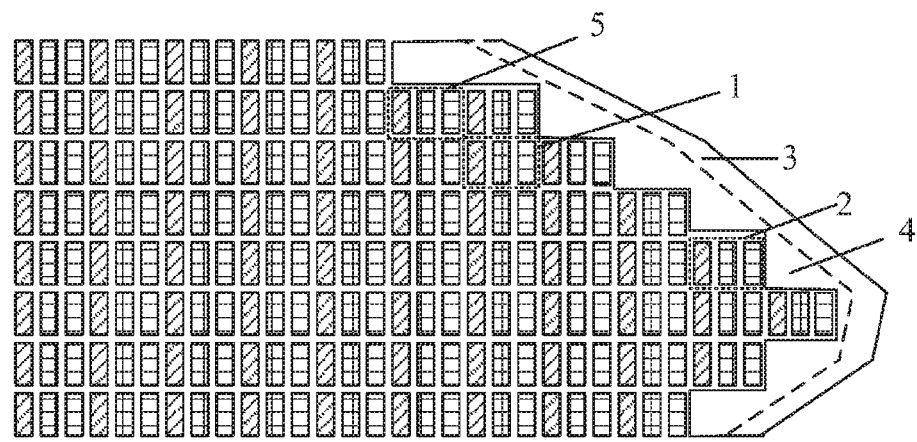
FIG. 4 is a schematic structural diagram of a display panel in Embodiments 3 and 4 of the present invention.
Figure 5:
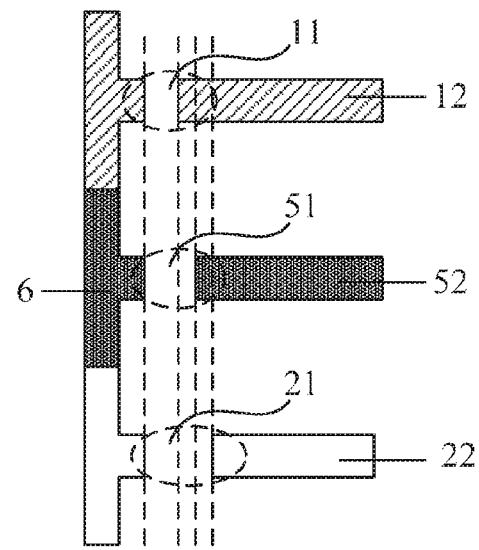
FIG. 5 is a schematic diagram illustrating a first set length, a second set length and a third set length of the display panel in Embodiment 3 of the present invention.

Referring to FIGS. 4 and 5, this embodiment provides a display panel, which has a structure similar to that of the display panel in Embodiment 1, and differs from the display panel of Embodiment 1 in that, at least one row of pixel units further include a submarginal pixel unit 5.

In this embodiment, the submarginal pixel unit 5 is between the central pixel unit 1 and the marginal pixel unit 2. For example, in the example shown in FIG. 5, the submarginal pixel unit 5 refers to a pixel unit that has only one side in contact with the filling area 4.

Each submarginal pixel unit 5 includes a plurality of sub-pixels (generally includes an R sub-pixel, a G sub-pixel and a B sub-pixel) and third thin film transistors respectively corresponding to the plurality of sub-pixels, and each third thin film transistor has a third semiconductor region 51; a length of the third semiconductor region 51 is set to be a third set length, and a width of the third semiconductor region 51 is set to be a third set width. It could be understood that the third semiconductor region 51 forms a third channel region when being energized.

As shown in FIG. 5, for each pixel unit (a central pixel unit 1 or a marginal pixel unit 2 or a submarginal pixel unit 5), the pixel electrode signal line 6 for supplying a voltage may be connected to a pixel electrode (a central pixel electrode 12 or a marginal pixel electrode 22 or a submarginal pixel electrode 52) via the semiconductor region (the first semiconductor region 11 or the second semiconductor region 21 or the third semiconductor region 51). In fact, the pixel electrode signal line 6 is formed as a whole, but in order to distinguish different parts of the pixel electrode signal line 6 corresponding to different pixel units, the different parts of the pixel electrode signal line 6 are shown in different colors in FIG. 5. When a voltage is applied, carriers move from the pixel electrode signal line 6 to the pixel electrode or from the pixel electrode to the pixel electrode signal line 6 (a moving direction of the carriers between the pixel electrode signal line 6 and the pixel electrode depends from polarity of the applied voltage and polarity of the carriers), and a movable distance of the carriers between the pixel electrode signal line 6 and the pixel electrode is the length of the channel region.

In the embodiment, the second set length is larger than the third set length, and the third set length is larger than the first set length. As the second set length of the marginal pixel unit 2, the first set length of the central pixel unit 1 and the third set length of the submarginal pixel unit 5 satisfy the relation that the second set length >the third set length >the first set length; when a voltage is applied, a moving distance of carriers in the second semiconductor region 21 is the longest, a moving distance of carriers in the third semiconductor region 51 follows, and a moving distance of carriers in the first semiconductor region 11 is the shortest, that is, when carriers in the first semiconductor region 11 completely reach the central pixel electrode 12 from the pixel electrode signal line 6, carriers in the second semiconductor region 21 and the third semiconductor region 51 have not completely reached the marginal pixel electrode 22 and the submarginal pixel electrode 52 from corresponding parts of the pixel electrode signal line 6. That is to say, when charging of the central pixel unit 1 is finished, charging of the marginal pixel unit 2 and charging of the submarginal pixel unit 5 have not finished, but the amount of charge on the submarginal pixel unit 5 is larger than that on the marginal pixel unit 2, and at this point, supply of the voltage is stopped, so that charging efficiency of the marginal pixel unit 2 is lower than that of the submarginal pixel unit 5, and the charging efficiency of the submarginal pixel unit 5 is lower than that of the central pixel unit 1. Therefore, during display, display brightness of the marginal pixel unit 2 is lower than that of the submarginal pixel unit 5, and the display brightness of the submarginal pixel unit 5 is lower than that of the central pixel unit 1, so that brightness contrast between the central pixel unit 1 and the filling area 4 is reduced gradually, i.e., a brightness buffer effect is achieved, visibility of a "saw-toothed" edge to naked eyes is weakened, and the "saw-toothed" visual effect of the marginal pixel units 2 is attenuated, which further improves visual effect at the edge of an abnormity panel and improves user experience. It should be noted that, as the submarginal pixel unit 5 is provided between the central pixel unit 1 and the marginal pixel unit 2, the brightness contrast between the central pixel unit 1 and the filling region 4 can be reduced in a softer manner.

It should be noted that in this embodiment, relation among the first set width, the second set width and the third set width is not limited, for example, the first set width, the second set width and the third set width may be equal, or the first set width may be larger than the third set width, and the third set width is larger than the second set width. Needless to say, the first set width may be slightly smaller than the third set width, and the third set width may be slightly smaller than the second set width, as long as the display brightness of the marginal pixel unit 2 can be smaller than that of the submarginal pixel unit 5, and the display brightness of the submarginal pixel unit 5 can be smaller than that of the central pixel unit 1, during display.

In the display panel of the embodiment, by setting the second set length to be larger than the third set length, and setting the third set length to be larger than the first set length, charging efficiency of the marginal pixel unit 2 is lower than that of the submarginal pixel unit 5, and charging efficiency of the submarginal pixel unit 5 is lower than that of the central pixel unit 1, so that during display, the display brightness of the marginal pixel unit 2 is smaller than that of the submarginal pixel unit 5, and the display brightness of the submarginal pixel unit 5 is smaller than that of the central pixel unit 1, so as to gradually reduce brightness contrast between the central pixel unit 1 and the filling area 4, i.e., to achieve a brightness buffer effect, weaken visibility of a "saw-toothed" edge to naked eyes, and attenuate the "saw-toothed" visual effect of the marginal pixel units 2, which further improves visual effect at the edge of an abnormity panel and improves user experience. In addition, as the submarginal pixel unit 5 is provided between the central pixel unit 1 and the marginal pixel unit 2, the brightness contrast between the central pixel unit 1 and the filling region 4 can be reduced in a softer manner, and brightness transition can be smoother.

Embodiment 4

Figure 6:
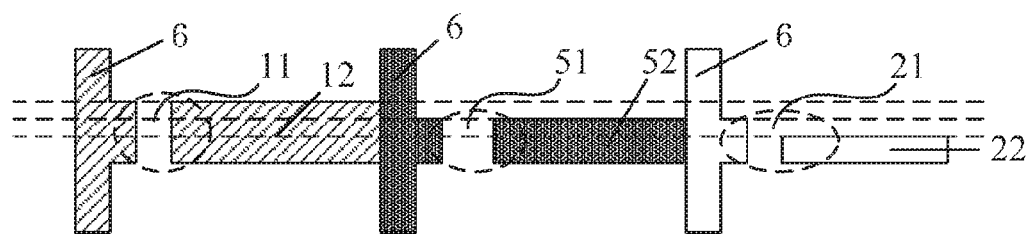
FIG. 6 is a schematic diagram illustrating a first set width, a second set width and a third set width of the display panel in Embodiment 4 of the present invention.

Referring to FIGS. 4 and 6, this embodiment provides a display panel, which has a structure similar to that of the display panel in Embodiment 3, and differs from the display panel of Embodiment 3 in that, the second set width is smaller than the third set width, and the third set width is smaller than the first set width. It should be noted that width of a channel region in this embodiment refers to a length of the channel region in a direction perpendicular to the moving direction of carriers, and the specific definition thereof may refer to Embodiment 2.

Because the second set width of the marginal pixel unit 2, the first set width of the central pixel unit 1 and the third set width of the submarginal pixel unit 5 meet the relation that the second set width <the third set width <the first set width, when a voltage is applied, the total amount of carriers flowing through the second semiconductor region 21 is the smallest, the total amount of carriers flowing through the third semiconductor region 51 is slightly larger than the total amount of the carriers flowing through the second semiconductor region 21, and the total amount of carriers flowing through the first semiconductor region 11 is the largest. Therefore, when charging of the central pixel unit 1 is finished, charging of the marginal pixel unit 2 and charging of the submarginal pixel unit 5 have not finished, but the amount of charge on the submarginal pixel unit 5 is larger than that on the marginal pixel unit 2, and at this point, supply of the voltage is stopped, so that charging efficiency of the marginal pixel unit 2 is lower than that of the submarginal pixel unit 5, and the charging efficiency of the submarginal pixel unit 5 is lower than that of the central pixel unit 1. Therefore, during display, display brightness of the marginal pixel unit 2 is lower than that of the submarginal pixel unit 5, and the display brightness of the submarginal pixel unit 5 is lower than that of the central pixel unit 1, so that brightness contrast between the central pixel unit 1 and the filling area 4 is reduced gradually, i.e., a brightness buffer effect is achieved, visibility of a "saw-toothed" edge to naked eyes is weakened, and the "saw-toothed" visual effect of the marginal pixel units 2 is attenuated, which further improves visual effect at the edge of an abnormity panel and improves user experience. In addition, as the submarginal pixel unit 5 is provided between the central pixel unit 1 and the marginal pixel unit 2, the brightness contrast between the central pixel unit 1 and the filling region 4 can be reduced in a softer manner.

It should be noted that in this embodiment, relation among the first set length, the second set length and the third set length is not limited, for example, the first set length, the second set length and the third set length may be equal, or the first set length may be smaller than the third set length, and the third set length may be smaller than the second set length. Needless to say, the first set length may be slightly larger than the third set length, and the third set length may be slightly larger than the second set length, as long as the display brightness of the marginal pixel unit 2 can be smaller than that of the submarginal pixel unit 5, and the display brightness of the submarginal pixel unit 5 can be smaller than that of the central pixel unit 1, during display.

In the display panel of the embodiment, by setting the second set width to be smaller than the third set width, and setting the third set width to be smaller than the first set width, charging efficiency of the marginal pixel unit 2 is lower than that of the submarginal pixel unit 5, and charging efficiency of the submarginal pixel unit 5 is lower than that of the central pixel unit 1, so that during display, the display brightness of the marginal pixel unit 2 is smaller than that of the submarginal pixel unit 5, and the display brightness of the submarginal pixel unit 5 is smaller than that of the central pixel unit 1, so as to gradually reduce brightness contrast between the central pixel unit 1 and the filling area 4, i.e., to achieve a brightness buffer effect, weaken visibility of a "saw-toothed" edge to naked eyes, and attenuate the "saw-toothed" visual effect of the marginal pixel units 2, which further improves visual effect at the edge of an abnormity panel and improves user experience. In addition, as the submarginal pixel unit 5 is provided between the central pixel unit 1 and the marginal pixel unit 2, the brightness contrast between the central pixel unit 1 and the filling region 4 can be reduced in a softer manner, and brightness transition can be smoother.

Embodiment 5

This embodiment provides a display device, which includes any one of the display panels described in Embodiments 1 to 4. The display device may be any product or component having a display function such as a liquid crystal display panel, an electronic paper, a mobile phone, a tablet computer, a television, a display, a notebook computer, a digital photo frame, a navigator or the like.

Because the display device provided by the embodiment includes the display panel in Embodiments 1 to 4, brightness of the marginal pixel unit 2 can be lower than that of the central pixel unit 1 during display, so as to reduce brightness contrast between the central pixel unit 1 and the filling area 4, i.e., to achieve a brightness buffer effect, weaken visibility of a "saw-toothed" edge to naked eyes, and attenuate the "saw-toothed" visual effect of the marginal pixel units 2, which further improves visual effect at the edge of an abnormity panel and improves user experience.

It could be understood that the above implementations are merely exemplary implementations adopted for describing the principle of the disclosure, but the disclosure is not limited thereto. For those of ordinary skill in the art, various variations and improvements may be made without departing from the spirit and essence of the disclosure, and these variations and improvements shall also be regarded as falling into the protection scope of the disclosure.

What is claimed is:

1. A display panel, comprising multiple rows of pixel units, edges of the multiple rows of pixel units being arranged in a step-like manner, each row of pixel units comprising at least one central pixel unit and at least one marginal pixel unit, wherein each central pixel unit comprises a plurality of sub-pixels and first thin film transistors respectively corresponding to the plurality of sub-pixels of a respective central pixel unit, and each first thin film transistor has a first semiconductor region;

each marginal pixel unit comprises a plurality of sub-pixels and second thin film transistors respectively corresponding to the plurality of sub-pixels of a respective marginal pixel unit, and each second thin film transistor has a second semiconductor region; a length of the first semiconductor region is set to be a first set length, a width of the first semiconductor region is set to be a first set width, a length of the second semiconductor region is set to be a second set length, and a width of the second semiconductor region is set to be a second set width such that brightness of the marginal pixel unit is smaller than brightness of the central pixel unit during display.

2. The display panel according to claim 1, wherein the first semiconductor region forms a first channel region when being energized, and the second semiconductor region forms a second channel region when being energized.

3. The display panel according to claim 1, wherein the second set length is larger than the first set length.

4. The display panel according to claim 3, wherein the second set width is equal to the first set width.

5. The display panel according to claim 1, wherein the second set width is smaller than the first set width.

6. The display panel according to claim 3, wherein the second set width is smaller than the first set width.

7. The display panel according to claim 5, wherein the second set length is equal to the first set length.

8. The display panel according to claim 1, wherein at least one row of pixel units further comprise a submarginal pixel unit between the central pixel unit and the marginal pixel unit, each submarginal pixel unit comprises a plurality of sub-pixels and third thin film transistors respectively corresponding to the plurality of sub-pixels of a respective submarginal pixel unit, and each third thin film transistor has a third semiconductor region; a length of the third semiconductor region is set to be a third set length, a width of the third semiconductor region is set to be a third set width such that brightness of the submarginal pixel unit is smaller than brightness of the central pixel unit but larger than brightness of the marginal pixel unit during display.

9. The display panel according to claim 8, wherein the third semiconductor region forms a third channel region when being energized.

10. The display panel according to claim 8, wherein the second set length is larger than the third set length, and the third set length is larger than the first set length.

11. The display panel according to claim 10, wherein the first set width, the second set width and the third set width are equal.

12. The display panel according to claim 8, wherein the second set width is smaller than the third set width, and the third set width is smaller than the first set width.

13. The display panel according to claim 10, wherein the second set width is smaller than the third set width, and the third set width is smaller than the first set width.

14. The display panel according to claim 12, wherein the first set length, the second set length and the third set length are equal.

15. The display panel according to claim 1, wherein the display panel is any one of an in-plane switching display panel, an advanced super dimension switch display panel and a twisted nematic display panel, and when the display panel is the twisted nematic display panel, the twisted nematic display panel is in normally black mode.

16. A display device, comprising the display panel according to claim 1.

17. The display device according to claim 16, wherein the second set length is larger than the first set length.

18. The display device according to claim 16, wherein the second set width is smaller than the first set width.

19. The display device according to claim 16, wherein at least one row of pixel units further comprise a submarginal pixel unit between the central pixel unit and the marginal pixel unit, each submarginal pixel unit comprises a plurality of sub-pixels and third thin film transistors respectively corresponding to the plurality of sub-pixels of a respective submarginal pixel unit, and each third thin film transistor has a third semiconductor region; a length of the third semiconductor region is set to be a third set length, a width of the third semiconductor region is set to be a third set width such that brightness of the submarginal pixel unit is smaller than brightness of the central pixel unit but larger than brightness of the marginal pixel unit during display.

20. The display device according to claim 19, wherein the second set length is larger than the third set length, and the third set length is larger than the first set length; or the second set width is smaller than the third set width, and the third set width is smaller than the first set width.

* * * * *